United States Patent
Namkung et al.

(10) Patent No.: US 9,589,696 B2
(45) Date of Patent: Mar. 7, 2017

(54) SEMICONDUCTOR DEVICE USING COMPOSITION FOR ANISOTROPIC CONDUCTIVE ADHESIVE FILM OR ANISOTROPIC CONDUCTIVE ADHESIVE FILM

(71) Applicants: Hyun Hee Namkung, Uiwang-si (KR); Jae Sun Han, Uiwang-si (KR); Hyun Wook Kim, Uiwang-si (KR); Jin Young Seo, Uiwang-si (KR); Kwang Jin Jung, Uiwang-si (KR); Dong Seon Uh, Uiwang-si (KR)

(72) Inventors: Hyun Hee Namkung, Uiwang-si (KR); Jae Sun Han, Uiwang-si (KR); Hyun Wook Kim, Uiwang-si (KR); Jin Young Seo, Uiwang-si (KR); Kwang Jin Jung, Uiwang-si (KR); Dong Seon Uh, Uiwang-si (KR)

(73) Assignee: CHEIL INDUSTRIES, INC., Gumi-Si, Kyeongsangbuk-Do (KR)

( * ) Notice: Subject to any disclaimer, the term of this patent is extended or adjusted under 35 U.S.C. 154(b) by 781 days.

(21) Appl. No.: 13/667,146

(22) Filed: Nov. 2, 2012

(65) Prior Publication Data

US 2013/0113119 A1 May 9, 2013

(30) Foreign Application Priority Data

Nov. 4, 2011 (KR) ........................ 10-2011-0114432

(51) Int. Cl.

| | |
|---|---|
| *H01B 1/20* | (2006.01) |
| *H01L 23/00* | (2006.01) |
| *H01B 1/12* | (2006.01) |
| *H01L 23/482* | (2006.01) |
| *H01B 1/22* | (2006.01) |
| *C09J 9/02* | (2006.01) |
| *C09J 133/06* | (2006.01) |
| *C08F 230/02* | (2006.01) |
| *C08F 222/10* | (2006.01) |

(52) U.S. Cl.
CPC ............... *H01B 1/124* (2013.01); *C09J 9/02* (2013.01); *C09J 133/068* (2013.01); *H01B 1/22* (2013.01); *H01L 23/4828* (2013.01); *H01L 24/29* (2013.01); *C08F 230/02* (2013.01); *C08F 2222/102* (2013.01); *H01L 2224/2929* (2013.01); *H01L 2224/2939* (2013.01); *H01L 2224/29339* (2013.01); *H01L 2224/29344* (2013.01); *H01L 2224/29347* (2013.01); *H01L 2224/29355* (2013.01); *H01L 2224/29393* (2013.01); *H01L 2224/29439* (2013.01); *H01L 2224/29444* (2013.01); *H01L 2224/29455* (2013.01); *H01L 2924/07811* (2013.01); *H01L 2924/15788* (2013.01)

(58) Field of Classification Search
CPC ......... H01B 1/00; H01B 1/20; H01L 2224/31; H01L 2224/83; H01L 2924/06; H01L 2924/078; H01L 2924/30101
See application file for complete search history.

(56) References Cited

U.S. PATENT DOCUMENTS

| | | | |
|---|---|---|---|
| 5,001,542 A * | 3/1991 | Tsukagoshi et al. | 257/746 |
| 7,629,056 B2 | 12/2009 | Watanabe et al. | |
| 2008/0042280 A1 * | 2/2008 | Lin et al. | 257/751 |
| 2010/0148130 A1 * | 6/2010 | Namkung | C08F 283/008 252/513 |
| 2011/0133130 A1 * | 6/2011 | Kim et al. | 252/500 |
| 2012/0138868 A1 * | 6/2012 | Arifuku | B82Y 10/00 252/510 |

FOREIGN PATENT DOCUMENTS

| | | | |
|---|---|---|---|
| JP | 3587859 | 11/2004 | |
| JP | 2010-123418 | 6/2010 | |
| JP | WO 2010125965 A1 * | 11/2010 | ............ B82Y 10/00 |
| KR | 10-2010-0017828 A | 2/2010 | |

* cited by examiner

*Primary Examiner* — Mark Kopec
(74) *Attorney, Agent, or Firm* — Lee & Morse, P.C.

(57) ABSTRACT

A semiconductor device bonded by an anisotropic conductive adhesive composition, the anisotropic conductive adhesive composition having a solid content ratio between a polymer binder system and a curing system of about 40:60 to about 60:40, and a coefficient of thermal expansion of about 150 ppm/° C. or less at about 100° C. or less.

16 Claims, No Drawings

SEMICONDUCTOR DEVICE USING COMPOSITION FOR ANISOTROPIC CONDUCTIVE ADHESIVE FILM OR ANISOTROPIC CONDUCTIVE ADHESIVE FILM

CROSS-REFERENCE TO RELATED APPLICATION

This application claims priority under 35 U.S.C. §119 to Korean Patent Application No. 10-2011-0114432, filed on Nov. 4, 2011, in the Korean Intellectual Property Office, and entitled: "Semiconductor Device Using Composition for Anisotropic Conductive Adhesive Film or Anisotropic Conductive Adhesive Film," the entire contents of which is hereby incorporated by reference.

BACKGROUND

Embodiments relate to a semiconductor device using a composition for an anisotropic conductive adhesive film, and a composition for an anisotropic conductive adhesive film.

SUMMARY

Embodiments are directed to a semiconductor device bonded by an anisotropic conductive adhesive composition, the anisotropic conductive adhesive composition may have a solid content ratio between a polymer binder system and a curing system of about 40:60 to about 60:40, and a coefficient of thermal expansion of about 150 ppm/° C. or less at about 100° C. or less.

The polymer binder system may include an acrylic acid ester copolymer, and the curing system may include a bisphenol fluorene diacrylate and an isocyanuric acid ethylene oxide modified diacrylate.

The total amount of the bisphenol fluorene diacrylate and the isocyanuric acid ethylene oxide modified diacrylate may be about 25 to about 50 wt % based on a total amount of the anisotropic conductive adhesive composition in terms of solid content.

Embodiments also are directed to a semiconductor device bonded by an anisotropic conductive adhesive composition, the anisotropic conductive adhesive composition may include an acrylic acid ester copolymer, at least one selected from the group of a styrene-acrylonitrile resin, an acrylonitrile butadiene rubber, a urethane acrylate resin, an ester urethane resin, and a urethane resin other than the urethane acrylate resin and the ester urethane resin, an isocyanuric acid ethylene oxide modified diacrylate, and a bisphenol fluorene diacrylate.

The styrene-acrylonitrile resin, the acrylonitrile butadiene rubber, the urethane acrylate resin, the ester urethane resin and the urethane resin other than the urethane acrylate resin and the ester urethane resin may have a glass transition temperature (Tg) of about 100° C. or higher.

The total amount of the bisphenol fluorene diacrylate and the isocyanuric acid ethylene oxide modified diacrylate may be about 25 to about 50 wt % based on a total amount of the anisotropic conductive adhesive composition in terms of solid content.

The anisotropic conductive adhesive composition may further include a (meth)acrylate group containing compound, an organic peroxide, and conductive particles.

The anisotropic conductive adhesive composition may include about 20 to about 40 wt % of the acrylic acid ester copolymer, about 1 to about 20 wt % of the at least one selected from the group of the styrene-acrylonitrile resin, the acrylonitrile butadiene rubber, the urethane acrylate resin, the ester urethane resin and the urethane resin other than the urethane acrylate resin and the ester urethane resin, about 5 to about 25 wt % of the isocyanuric acid ethylene oxide modified diacrylate, about 5 to about 25 wt % of the bisphenol fluorene diacrylate, about 1 to about 5 wt % of the (meth)acrylate group containing compound, about 1 to about 10 wt % of the organic peroxide, and about 1 to about 10 wt % of the conductive particles, based on a total amount of the anisotropic conductive adhesive composition in terms of solid content.

Embodiments also are directed to a semiconductor device, including an anisotropic conductive adhesive film having a solid content ratio between a polymer binder system and a curing system of about 40:60 to about 60:40, and an electrode having a height of about 25 μm or more bonded by the anisotropic conductive adhesive film.

The polymer binder system may include an acrylic acid ester copolymer, and the curing system may include a bisphenol fluorene diacrylate and an isocyanuric acid ethylene oxide modified diacrylate.

The anisotropic conductive adhesive film may have a connection time of about 5 seconds or less at about 160 to about 200° C.

The anisotropic conductive adhesive film may have a bubble area of about 5% or less based on a total area of the anisotropic conductive adhesive film.

The semiconductor device may include a film on glass form, and the anisotropic conductive adhesive film may be bonded to the glass.

Embodiments also are directed to a semiconductor device bonded by an anisotropic conductive adhesive film, the anisotropic conductive adhesive film may have an adhesive strength decreasing rate calculated by Equation 1 of greater than 0 and about 40% or less, and a connection resistance increasing rate calculated by Equation 2 of greater than 0 and about 20% or less:

$$\text{Adhesive strength decreasing rate (\%)} = |(A-B)/A| \times 100 \quad \text{Equation 1:}$$

$$\text{Connection resistance increasing rate (\%)} = |(C-D)/C| \times 100. \quad \text{Equation 2:}$$

Where, in Equation 1, A may be an adhesive strength after preliminary pressing at 80° C. and 1 MPa for 1 second and final pressing at 180° C. and 3 MPa for 5 seconds, B may be an adhesive strength after the preliminary pressing, the final pressing, and then reliability testing at 85° C. and 85% RH for 250 hours, and in Equation 2, C may be a connection resistance after preliminary pressing at 80° C. and 1 MPa for 1 second and final pressing at 180° C. and 3 MPa for 5 seconds, and D may be a connection resistance after the preliminary pressing, the final pressing, and then reliability testing at 85° C. and 85% RH for 250 hours.

The anisotropic conductive adhesive film may have an adhesive strength of about 700 gf/cm or more after the reliability testing and a connection resistance of about 2.5Ω or less after the reliability testing.

The anisotropic conductive adhesive film may have a minimum modulus when cured of about $1 \times 10^6$ gf/cm$^2$ or more while elevating a temperature at 10° C./min from 30 to 250° C.

A solid content ratio between a polymer binder system and a curing system in the anisotropic conductive adhesive film may be about 40:60 to about 60:40.

The polymer binder system may include an acrylic acid ester copolymer, and the curing system may include a bisphenol fluorene diacrylate and an isocyanuric acid ethylene oxide modified diacrylate.

Embodiments also are directed to a semiconductor device bonded by an anisotropic conductive adhesive composition, the anisotropic conductive adhesive composition may have a total amount of a bisphenol fluorene diacrylate and an isocyanuric acid ethylene oxide modified diacrylate of about 25 to about 50 wt % based on a total amount of the anisotropic conductive adhesive composition in terms of solid content.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

As used herein, the term "and/or" includes any and all combinations of one or more of the associated listed items. Expressions such as "at least one of," when preceding a list of items, modify the entire list of items and do not modify the individual items of the list.

According to an embodiment, an anisotropic conductive adhesive composition may have a solid content ratio between a polymer binder system and a curing system of about 40:60 to about 60:40, and a coefficient of thermal expansion of about 150 ppm/° C. or less at about 100° C. or less. The anisotropic conductive adhesive composition may include an acrylic acid ester copolymer as the polymer binder system, and a bisphenol fluorene diacrylate and an isocyanuric acid ethylene oxide modified diacrylate as the curing system. Here, the total amount of the bisphenol fluorene diacrylate and the isocyanuric acid ethylene oxide modified diacrylate may be about 25 to about 50 wt %, preferably about 30 to about 45 wt % based on the total amount of the anisotropic conductive adhesive composition in terms of solid content.

The solid content ratio between the polymer binder system and the curing system may be about 40:60 to about 60:40, and thus the content ratio of the curing system to the polymer binder system may be increased such that dimensional stability after curing may be improved. The dimensional stability after curing may be evaluated based on a coefficient of thermal expansion after curing. The anisotropic conductive adhesive composition may have a coefficient of thermal expansion of about 150 ppm/° C. or less at about 100° C. or less, preferably about 130 ppm/° C. or less, and more preferably about 110 ppm/° C. or less. The coefficient of thermal expansion is defined as extended length per unit temperature and unit length, measured while elevating temperature at 10° C./min from 25 to 250° C. after mounting the cured anisotropic conductive film on a probe of a TMA (TA Instruments). The coefficient of thermal expansion may be measured as a gradient of a graph indicated by a detector.

A weight ratio between the polymer binder system and the curing system may be adjusted to about 1:1, and thus improved connection reliability and dimensional stability may be achieved.

According to an embodiment, an anisotropic conductive adhesive composition may include an acrylic acid ester copolymer; at least one selected from the group of a styrene-acrylonitrile resin, an acrylonitrile butadiene rubber, a urethane acrylate resin, an ester urethane resin and a urethane resin other than the urethane acrylate resin and the ester urethane resin (these resins and rubber may be used alone or in combination); an isocyanuric acid ethylene oxide modified diacrylate; and a bisphenol fluorene diacrylate.

The styrene-acrylonitrile resin, the acrylonitrile butadiene rubber, the urethane acrylate resin, the ester urethane resin or the urethane resin other than the urethane acrylate resin and the ester urethane resin may have a glass transition temperature (Tg) of about 100° C. or higher.

The total amount of the bisphenol fluorene diacrylate and the isocyanuric acid ethylene oxide modified diacrylate may be about 25 to about 50 wt % based on the total amount of the anisotropic conductive adhesive composition in terms of solid content.

The total amount of the bisphenol fluorene diacrylate and the isocyanuric acid ethylene oxide modified diacrylate may be adjusted to about 25 to about 50 wt % based on the total amount of the anisotropic conductive adhesive composition, and thus not only may an improved rapid low-temperature curing of the anisotropic conductive resin composition be achieved, but also the modulus of the cured product may be improved, and thereby connection reliability and dimensional stability of the composition may be improved.

A solid content ratio of a polymer binder system including the acrylic acid ester copolymer and at least one of the styrene-acrylonitrile resin, the acrylonitrile butadiene rubber, the urethane acrylate resin, the ester urethane resin, and the urethane resin other than the urethane acrylate resin and the ester urethane resin to a curing system including the bisphenol fluorene diacrylate and the isocyanuric acid ethylene oxide modified diacrylate may be about 40:60 to about 60:40, preferably about 45:55 to about 55:45.

The anisotropic conductive adhesive composition according to an embodiment may further include a (meth)acrylate group containing compound, an organic peroxide, and/or conductive particles.

The anisotropic conductive adhesive composition may include about 20 to about 40 wt % of the acrylic acid ester copolymer; about 1 to about 20 wt % of at least one of the styrene-acrylonitrile resin, the acrylonitrile butadiene rubber, the urethane acrylate resin, the ester urethane resin, and the urethane resin other than the urethane acrylate resin and the ester urethane resin; about 5 to about 25 wt % of the isocyanuric acid ethylene oxide modified diacrylate; about 5 to about 25 wt % of the bisphenol fluorene diacrylate; about 1 to about 5 wt % of the (meth)acrylate group containing compound; about 1 to about 10 wt % of the organic peroxide; and about 1 to about 10 wt % of the conductive particles, based on the total amount thereof in terms of solid content.

According to an embodiment, a semiconductor device may include an anisotropic conductive adhesive film having a solid content ratio between a polymer binder system and a curing system of about 40:60 to about 60:40, and an electrode having a height of about 25 μm or more bonded by the anisotropic conductive adhesive film.

The anisotropic conductive adhesive film may include an acrylic acid ester copolymer as the polymer binder system, and a bisphenol fluorene diacrylate and an isocyanuric acid ethylene oxide modified diacrylate as the curing system.

There may be a limit to fulfill the filling ratio of the anisotropic conductive adhesive film for an FPC having a 25 μm or more-high electrode, and thus it may be desirable for the anisotropic conductive adhesive film to maintain adhesive strength and dimensional stability. The anisotropic conductive adhesive film may include a bisphenol fluorene diacrylate and an isocyanuric acid ethylene oxide modified diacrylate as the curing system and the solid content thereof may be adjusted to about 25 to about 50 wt % based on the total amount of the adhesive film in terms of solid content, and thus the anisotropic conductive adhesive film may have both a proper adhesive strength and dimensional stability.

The solid content ratio between the polymer binder system and the curing system in the anisotropic conductive adhesive film may be about 40:60 to about 60:40.

The anisotropic conductive adhesive film may have a connection time of about 5 seconds or less at about 160 to about 200° C. Thus, occurrence of bubbles in the connection time may be prevented, and the filling ratio may be increased, thereby adhesive strength and connection reliability may be enhanced.

The semiconductor device may include a film on glass (FOG) form.

According to an embodiment, an anisotropic conductive adhesive film may have an adhesive strength decreasing rate of greater than 0 and about 40% or less, calculated by Equation 1, and a connection resistance increasing rate of greater than 0 and about 20% or less, calculated by Equation 2:

$$\text{Adhesive strength decreasing rate (\%)} = |(A-B)/A| \times 100 \quad \text{Equation 1:}$$

$$\text{Connection resistance increasing rate (\%)} = |(C-D)/C| \times 100, \quad \text{Equation 2:}$$

Where, in Equation 1, A is adhesive strength after preliminary pressing at 80° C. and 1 MPa for 1 second and final pressing at 180° C. and 3 MPa for 5 seconds, B is adhesive strength after preliminary pressing, final pressing, and then reliability testing at 85° C. and 85% RH for 250 hours. In Equation 2, C is connection resistance after preliminary pressing at 80° C. and 1 MPa for 1 second and final pressing at 180° C. and 3 MPa for 5 seconds, and D is connection resistance after preliminary pressing, final pressing, and then reliability testing at 85° C. and 85% RH for 250 hours.

The anisotropic conductive adhesive film may have an adhesive strength of about 700 gf/cm or more after reliability testing, and a connection resistance of about 2.5Ω or less after reliability testing, and thus reliability may be improved, and connection failure may be substantially prevented.

The anisotropic conductive adhesive film may substantially prevent the occurrence of bubbles after preliminary pressing and final pressing and/or after reliability testing.

The anisotropic conductive adhesive film may be put on a circuit formed as part of a glass panel and subjected to preliminary pressing under the above conditions. Then, after removing a release film, a FPCB may be placed on the film and subjected to final pressing under the above conditions.

The adhesive strength may be measured by a suitable method. For example, a pressed part may be divided into 10 mm pieces, and the substrate or chip may be bent at 90°, followed by measuring adhesive strength while elevating a load cell at a constant rate. Preferably, a universal testing machine (H5KT, Hounsfield) is used to measure adhesive strength at 90°.

The connection resistance may be measured by a suitable method, for example, using a 2 point probe method. The 2 point probe method may use a resistance detector, and resistance between two points may be measured using two probes connected to the detector. Resistance may be calculated using voltage measured when the resistance detector applies 1 mA.

The anisotropic conductive adhesive film may have a minimum modulus of about $1 \times 10^6$ gf/cm$^2$ or more when cured while elevating temperature at about 10° C./min from about 30 to about 250° C.

A solid content ratio between a polymer binder system and a curing system in the anisotropic conductive adhesive film may be about 40:60 to about 60:40. The polymer binder system may include an acrylic acid ester copolymer, and the curing system may include a bisphenol fluorene diacrylate and an isocyanuric acid ethylene oxide modified diacrylate.

According to an embodiment, an anisotropic conductive adhesive composition may have the total amount of a bisphenol fluorene diacrylate and an isocyanuric acid ethylene oxide modified diacrylate of about 25 to about 50 wt % based on the total amount of the anisotropic conductive adhesive composition in terms of solid content.

The anisotropic conductive adhesive composition or film may have a connection time of about 5 seconds or less at about 160 to about 200° C. The connection time refers to a time of final pressing for connection of circuits which may be conducted at about 160 to about 200° C. and about 3 MPa for about 5 seconds or less.

The anisotropic conductive adhesive film may substantially prevent the occurrence of bubbles after preliminary pressing and final pressing and/or after reliability testing, and thus may provide improved connection reliability.

Occurrence of the bubbles may be evaluated by a suitable method. For example, the formation of bubbles between terminals may be observed using a microscope, and it may be considered that no bubbles have occurred if a bubble occurring area is 5% or less based on the total area of the film.

The anisotropic conductive adhesive film may have a minimum modulus of about $1 \times 10^4$ gf/cm$^2$ or more before curing, and may have a minimum modulus of $1 \times 10^6$ gf/cm$^2$ or more when cured, while elevating temperature at 10° C./min from 30 to 250° C.

The anisotropic conductive adhesive composition or film may be used for an FPC having an electrode with a height of about 25 μm or more.

Hereinafter, the components described above will be described in greater detail.

<Anisotropic Conductive Adhesive Composition>

Polymer Binder System (a) Acrylic Acid Ester Copolymer

The acrylic acid ester copolymer may be a suitable acrylic acid ester copolymer. For example, an acrylic acid ester copolymer prepared by reaction of ethyl acrylate (EA)/acrylonitrile (AN) as a major monomer with an epoxy functional group may be used, and an acrylic acid ester copolymer having a weight average molecular weight of about 100,000 to about 700,000 g/mol, preferably about 200,000 to about 600,000 g/mol, and more preferably about 300,000 to about 500,000 g/mol may be used. Examples of the acrylic acid ester copolymer may include acrylic ester copolymers obtained by polymerization of acrylic monomers such as ethyl, methyl, propyl, butyl, hexyl, octyl, and/or lauryl acrylates, methacrylate, and modifications thereof, for example, acrylates, acrylic acids, methacrylic acids, methyl methacrylates and modifications thereof.

The acrylic acid ester copolymer may include a hydroxyl group or carboxyl group, having an acid value of about 1 to about 100 mgKOH/g, and may further include an epoxy group or an alkyl group.

The acrylic acid ester copolymer may be compatible with the bisphenol fluorene diacrylate or the isocyanuric acid ethylene oxide modified diacrylate of the curing system in forming a solution, and thus may not be separated.

Further, the acrylic acid ester copolymer may have a good adhesion to a glass panel, and thus may function as a film forming agent (which may provide an effect of substantially preventing bubbles on a glass interface generated in a high height electrode).

(b) At least one selected from the group of a styrene-acrylonitrile resin, an acrylonitrile butadiene rubber, a urethane acrylate resin, an ester urethane resin, and a urethane resin other than the urethane acrylate resin and the ester urethane resin.

(b1) Styrene-Acrylonitrile Resin

The styrene-acrylonitrile resin may have transparency and heat resistance, particularly improved electric and mechanical properties, chemical resistance, dimensional stability, solvent resistance except to ketones, and optical transparency. The styrene-acrylonitrile resin may be synthesized and prepared as a styrene-acrylonitrile copolymer and a styrene-acrylonitrile-styrene copolymer, which may be prepared by a suitable method, for example, emulsion polymerization, suspension polymerization, and bulk polymerization. With increase in acrylonitrile content, the styrene-acrylonitrile resin may exhibit improved physical properties and characteristics but may have decreased processability or thermal stability during processing. Thus, continuous bulk polymerization which may provide excellent transparency and other physical properties (as compared with other processes) may be used except in certain cases (for example, preparing a styrene-acrylonitrile (SAN) resin having a high acrylonitrile content). Examples of the styrene-acrylonitrile resin may include AP series of SAN resin (Cheil Industries, Inc.), SAN series of SAN resin (Kumho Petrochemical Co., Ltd.), Lustran series of SAN resin (Bayer), and Luran S series of acrylonitrile-styrene-acrylonitrile (ASA) resin (BASF).

The styrene-acrylonitrile resin may have a Tg of about 100 to about 150° C., preferably about 110 to about 130° C., and a weight average molecular weight of about 50,000 to about 150,000 g/mol, preferably about 70,000 to about 120,000 g/mol.

(b2) Acrylonitrile Butadiene Rubber

The acrylonitrile butadiene rubber may be a copolymer prepared by emulsion polymerization of acrylonitrile and butadiene. The contents of acrylonitrile and butadiene in the copolymer may be a suitable contents and the polymerization method may be a suitable method. The acrylonitrile butadiene rubber may have a weight average molecular weight of about 50,000 to about 2,000,000 g/mol.

A carboxyl group-modified acrylonitrile butadiene rubber may be used. The carboxyl group may elevate stability of a resin mixture, and thus miscibility with other resins and additives may be improved, and processability may be improved (for example, coatability). Further, an increase in polarity may improve adhesive strength and may improve moisture resistance and heat resistance.

The carboxyl group-modified acrylonitrile butadiene rubber may have a weight average molecular weight of about 2,000 to about 270,000 g/mol, an acrylonitrile content of about 10 to about 60 wt %, and a carboxyl group content of about 1 to about 20 wt %. Preferably, the carboxyl group-modified acrylonitrile butadiene rubber has a weight average molecular weight of about 3,000 to about 250,000 g/mol, and an acrylonitrile content of about 20 to about 50 wt %.

If the weight average molecular weight of the carboxyl group-modified acrylonitrile butadiene rubber is within the above described range, thermal stability may be improved, solvent solubility may be improved, viscosity may be decreased in preparing a solution (to improve workability), and adhesive strength may be increased. Further, if the acrylonitrile content of the carboxyl group-modified acrylonitrile butadiene rubber is within the above described range, solubility of the composition may increase, and electrical insulating properties of the composition may be improved.

The carboxyl group-modified acrylonitrile butadiene rubber may be a suitable carboxyl group-modified acrylonitrile butadiene rubber. Examples of carboxyl group modified acrylonitrile butadiene rubber may include Vamac MR, Vamac Ultra IP, VMX30380 (E.I. Du Pont de Nemours and Company), N34, Nipol NBR, 1072, and 1072CGX (Zeon Co., Ltd.).

The acrylonitrile butadiene rubber may be present as a constituent of the polymer binder system in an amount of about 2 to about 10 wt %, preferably about 4 to about 8 wt %, and more preferably about 5 to about 7 wt % in terms of solid content based on the total amount of the anisotropic conductive adhesive composition. If the amount of the acrylonitrile butadiene rubber is within the above described range, adhesive strength of the composition to an adherend may increase, and flowability of the resin may be increased in thermal pressing due to low molecular weight.

(b3) Urethane Resin

The urethane resin may be a polymer resin having a urethane bond other than a urethane acrylate resin and an ester urethane resin, which may be prepared, e.g., by polymerization of isophorone diisocyanate with polytetramethylene glycol.

The urethane resin may have a weight average molecular weight of about 50,000 to about 2,000,000 g/mol.

As an example of the chemical structure of the urethane resin, the urethane resin may be prepared using a mixture including at least one organic diisocyanate, at least one polyol, and/or at least one bifunctional chain extender.

Examples of the organic diisocyanate may include m- and p-phenylene diisocyanates, chlorophenylene diisocyanate, α,α'-xylene diisocyanate, 2,4- and 2,6-toluene diisocyanates, mixtures of 2,4- and 2,6-toluene diisocyanates, toluidine diisocyanate, hexamethylene diisocyanate, 1,5-naphthalene diisocyanate, isophorone diisocyanate, cycloaliphatic diisocyanates, such as methylene bis(cyclohexyl isocyanate) including a 4,4'-isomer, a 2,4'-isomer, mixtures thereof, and all the geometric isomers thereof, including trans/trans, cis/trans, cis/cis, and mixtures thereof, cyclohexylene diisocyanates (1,2-; 1,3-; or 1,4-), 1-methyl-2,5-cyclohexylene diisocyanate, 1-methyl-2,4-cyclohexylene diisocyanate, 1-methyl-2,6-cyclohexylene diisocyanate, 4,4'-isopropylidene bis(cyclohexyl isocyanate), 4,4'-diisocyanato dicyclohexyl, all geometric isomers and mixtures thereof, and the like.

Further, the organic diisocyanate may include modified forms of methylene bis(phenyl isocyanate). Preferable examples of the organic diisocyanate include aromatic and aliphatic diisocyanates.

Examples of the polyol may include polyether diol, polyester diol, hydroxy-terminated polycarbonate, a hydroxy-terminated polybutadiene-acrylonitrile copolymer, dialkyl oxides such as ethylene oxide or propylene oxide, a hydroxy-terminated copolymer of dialkyl siloxane, and an amino-terminated polybutadiene-acrylonitrile copolymer, or combinations thereof.

Examples of the bifunctional chain extender may include aliphatic straight and branched chain diols having C2 to C10 in the chain. Such diols may include ethylene glycol, 1,3-propanediol, 1,4-butanediol, 1,5-pentanediol, 1,6-hexanediol, neopentyl glycol, 1,4-cyclohexandimethanol, hydroquinone bis(hydroxyethyl)ether, cyclohexylenediols (1,4-, 1,3-, and 1,2-isomers), isopropylidene bis(cyclohexanol), diethylene glycol, dipropylene glycol, ethanolamine, N-ethyldimethanolamine, and mixtures thereof.

(b4) Urethane Acrylate Resin

The urethane acrylate resin may have a glass transition temperature (Tg) of about 100° C. or less, and thus flowability may be improved, and adhesive strength may be increased due to a urethane group in a molecular chain thereof. In particular, when the urethane acrylate resin is used in the anisotropic conductive adhesive film, curing performance may be improved to reduce the temperature of a connection process.

The urethane acrylate resin may include, e.g., a diisocyanate, a polyol, a diol, and an acrylate.

The diisocyanate may include aromatic, aliphatic, alicyclic diisocyanates, and mixtures thereof. Examples of such diisocyanates may include tetramethylene-1,4-diisocyanate, hexamethylene-1,6-diisocyanate, cyclohexylene-1,4-diisocyanate, methylene bis(4-cyclohexyl diisocyanate), isophorone diisocyanate, and 4,4'-methylene bis(cyclohexyl isocyanate), and mixtures thereof.

The polyol may include, e.g., polyester polyol, polyether polyol, and polycarbonate polyol, which may have at least two hydroxyl groups in a molecular chain thereof. The polyester polyol may be preferably obtained by condensation of a dicarboxylic acid compound and a diol compound. Here, examples of the dicarboxylic acid compound may include succinic acid, glutaric acid, isophthalic acid, adipic acid, suberic acid, azelaic acid, sebacic acid, dodecanedicarboxylic acid, hexahydrophthalic acid, terephthalic acid, ortho-phthalic acid, tetrachlorophthalic acid, 1,5-naphthalenedicarboxylic acid, fumaric acid, maleic acid, itaconic acid, citraconic acid, mesaconic acid, and tetrahydrophthalic acid. Examples of the diol compound may include ethylene glycol, propylene glycol, 1,3-propanediol, 1,3-butanediol, 1,4-butanediol, 1,5-pentanediol, 1,6-hexanediol, neopentyl glycol, diethylene glycol, dipropylene glycol, triethylene glycol, tetraethylene glycol, dibutylene glycol, 2-methyl-1,3-pentanediol, 2,2,4-trimethyl-1,3-pentanediol, and 1,4-cyclohexanedimethanol. Examples of the polyether polyol may include polyethylene glycol, polypropylene glycol, and polytetraethylene glycol. In the polyether polyol, the polyol may have a weight average molecular weight of about 400 to about 10,000 g/mol, preferably about 400 to about 3,000 g/mol. Examples of the polycarbonate polyol may include polycarbonate polyols derived from polyalkylene carbonate and silicone.

Examples of the diol may include 1,3-propanediol, 1,3-butanediol, 1,4-butanediol, 1,5-pentanediol, 1,6-hexanediol, neopentyl glycol, diethylene glycol, dipropylene glycol, triethylene glycol, tetraethylene glycol, dibutylene glycol, 2-methyl-1,3-pentanediol, 2,2,4-trimethyl-1,3-pentanediol, and 1,4-cyclohexanedimethanol.

The acrylate may include, e.g., hydroxyl acrylates or amine acrylates.

The urethane acrylate resin that may include the above four components may be prepared by polyaddition so that the mole ratio of a diisocyanate group (NCO) to a hydroxyl group (OH) is about 1.04 to about 1.6 and the polyol content is about 70% or less among the three components other than the acrylate, followed by reaction of one terminal functional group of the urethane synthesized by polyaddition (i.e., one diisocyanate group), with hydroxyl acrylate or amine acrylate at a mole ratio of about 0.1 to about 2.1. Further, the remaining isocyanate groups may be subjected to reaction with alcohols, thereby producing the urethane acrylate resin. Here, polyaddition may be carried out by a suitable method. Also, polyaddition may be conducted, e.g., at a temperature of about 90° C. and a pressure of about 1 atm for about 5 hours using a tin-based catalyst.

The urethane acrylate resin may have a weight average molecular weight of about 1,000 to about 100,000 g/mol and may include at least one terminal functional group of acrylate.

The urethane acrylate resin may have a weight average molecular weight of about 20,000 to about 100,000 g/mol, preferably about 20,000 to about 40,000 g/mol.

(b5) Ester Urethane Resin

The ester urethane resin may be a combination of organic compounds having a urethane group and an ester group. The ester urethane compound may have a urethane group and an ester group in the main chain thereof. The ester urethane compound may be obtained, for example, by reaction of a polyester polyol and a diisocyanate. The ester urethane compound obtained by this reaction may be generally referred to as a polyester urethane resin.

Examples of diisocyanate may include aromatic, alicyclic, or aliphatic diisocyanates, such as 2,4-tolylene diisocyanate (TDI), 4,4'-diphenylmethane diisocyanate (MDI), 1,6-hexamethylene diisocyanate (HDI), and isophorone diisocyanate (IPDI).

The polyester polyol may be a polymer having a plurality of ester groups and a plurality of hydroxyl groups. The polyester polyol may be obtained, for example, by reaction of dicarboxylic acid and diol. Examples of the dicarboxylic acid may include aromatic or aliphatic dicarboxylic acids, such as terephthalic acid, isophthalic acid, adipic acid, and sebacic acid. Examples of the diol may include glycols, such as ethylene glycol, propylene glycol, 1,4-butanediol, hexanediol, neopentyl glycol, diethylene glycol, and triethylene glycol.

The ester urethane compound may have a glass transition temperature (Tg) of about 100° C. or higher. The glass transition temperature (Tg) of the ester urethane compound may be adjusted to about 100° C. or higher by properly adapting the kind or molecular weight of the polyester polyol or diisocyanate.

The ester urethane compound may have anionic properties, and thus adhesive strength may be improved. The anionic ester urethane compound may be obtained by copolymerizing diols or diamines having a sulfonic group or carboxylic group to a side chain in the reaction of the polyester polyol with the dissocyanate. That is, the ester urethane compound may contain a sulfonic acid or carboxylic acid.

The ester urethane compound may have an aromatic group including a benzene ring or a cycloaliphatic group including a cyclohexane ring.

A mixture of at least two kinds of ester urethane compounds may be used. For example, a compound obtained by reaction of an aromatic polyester polyol with an aliphatic diisocyanate and a compound obtained by reaction of an aliphatic polyester polyol with an aromatic diisocyanate may be combined.

The ester urethane compound may have a weight average molecular weight of about 5,000 to about 100,000 g/mol. If the weight average molecular weight of the ester urethane compound is within the above described range film formability may increase when the composition is formed into a film, and the composition may be more easily dissolved in or more compatible with a solvent, (thus preparing a coating solution for forming a film may be easier).

Curing System (c) Isocyanuric Acid Ethylene Oxide Modified Diacrylate

The isocyanuric acid ethylene oxide modified diacrylate may have low reaction temperature at which curing starts and a rapid reaction rate, and thus the anisotropic conductive resin composition may be cured quickly. Accordingly, the isocyanuric acid ethylene oxide modified diacrylate may provide improved adhesive strength and connection reliability in connection at low temperature.

The isocyanuric acid ethylene oxide modified diacrylate may have an exothermic peak of about 86 to about 97° C., evaluated by differential scanning calorimetry (DSC). Particularly, the isocyanuric acid ethylene oxide modified diacrylate preferably has an exothermic peak of about 92 to about 95° C., and thus the anisotropic conductive adhesive film may be sufficiently cured in a short final pressing time. If the exothermic peak of the isocyanuric acid ethylene oxide modified diacrylate is within the above described range, the anisotropic conductive adhesive film may not be cured too quickly (if the film is cured too quickly, an electrode may not be sufficiently pressed), and the composition may not take too long to be cured, and thus improved reliability of connection resistance may be achieved.

The isocyanuric acid ethylene oxide modified diacrylate may be present in an amount of about 10 to about 30 wt %, preferably about 15 to about 25 wt % in terms of solid content based on the total amount of the anisotropic conductive adhesive composition. If the amount of the isocyanuric acid ethylene oxide modified diacrylate is within the above described range, the composition may have improved connection reliability, and increased adhesive strength.

(d) Bisphenol Fluorene Diacrylate

The bisphenol fluorene diacrylate may serve to increase a filling ratio, control flowability of the composition, and improve the modulus of a cured product, which may enhance reliability due to intrinsic properties of fluorene.

Examples of the bisphenol fluorene diacrylate may include bisphenol fluorene epoxy diacrylate and bisphenol fluorene urethane diacrylate.

The bisphenol fluorene diacrylate may have a weight average molecular weight of about 1,000 g/mol to about 2,000 g/mol, preferably about 1,200 g/mol to about 1,600 g/mol, and more preferably about 1,300 g/mol to about 1,500 g/mol.

Preferably, a bisphenol fluorene diacrylate including a group represented by Formula 1 is used:

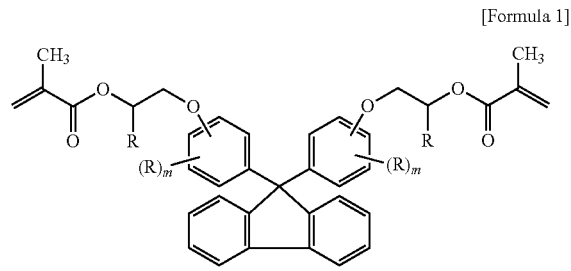

[Formula 1]

where each R independently may be hydrogen, an alkyl group, an alkoxy group, an aryl group, or a cycloalkyl group, each m independently may be an integer from 0 to 4.

(e) (Meth)Acrylate Group Containing Compound

The (meth)acrylate group containing compound may be a radical polymerizable compound, and thus may be a component of the curing system that ensures improved adhesive strength and connection reliability between connected layers as radical curing reaction occurs.

The (meth)acrylate group containing compound may include (meth)acrylate oligomers and/or (meth)acrylate monomers. The (meth)acrylate oligomers may include a suitable (meth)acrylate oligomer, for example, urethane (meth)acrylates, epoxy(meth)acrylates, polyester(meth)acrylates, fluorine(meth)acrylates, fluorene (meth)acrylates, silicone(meth)acrylates, phosphorus(meth)acrylates, maleimide modified (meth)acrylates, and (meth)acrylates which have a weight average molecular weight of about 1,000 to about 100,000 g/mol.

The urethane(meth)acrylates may include molecules with an intermediate structure synthesized from, e.g., polyester polyol, polyether polyol, polycarbonate polyol, polycaprolactone polyol, a ring-opened tetrahydrofuran-propyleneoxide copolymer, polybutadiene diol, polydimethylsiloxane diol, ethylene glycol, propylene glycol, 1,4-butanediol, 1,5-pentanediol, 1,6-hexanediol, neopentyl glycol, 1,4-cyclohexane dimethanol, bisphenol A, hydrogenated bisphenol A, 2,4-toluene diisocyanate, 1,3-xylene diisocyanate, 1,4-xylene diisocyanate, 1,5-naphthalene diisocyanate, 1,6-hexane diisocyanate, isophorone diisocyanate, and/or bisphenol A propyleneoxide modified diacrylate.

The epoxy(meth)acrylates may include molecules with an intermediate structure selected from, e.g., 2-bromohydroquinone, resorcinol, catechol, bisphenol A, bisphenol F, bisphenol AD, bisphenol S, 4,4'-dihydroxybiphenyl, bis(4-hydroxyphenyl)ether, and/or (meth)acrylate oligomers having an alkyl, aryl, methylol, allyl, cycloaliphatic, halogen (e.g., tetrabromobisphenol A), or nitro group.

In addition, the (meth)acrylate oligomers may include compounds containing at least two maleimide groups in the molecule, for example, 1-methyl-2,4-bismaleimidebenzene, N,N'-m-phenylenebismaleimide, N,N'-p-phenylenebismaleimide, N,N'-m-toluylene bismaleimide, N,N'-4,4-biphenylenebismaleimide, N,N'-4,4-(3,3'-dimethylbiphenylene) bismaleimide, N,N'-4,4-(3,3'-dimethyldiphenylmethane) bismaleimide, N,N'-4,4-(3,3'-diethyldiphenylmethane) bismaleimide, N,N'-4,4-diphenylmethanebismaleimide, N,N'-4,4-diphenylpropanebismaleimide, N,N'-4,4-diphenyletherbismaleimide, N,N'-3,3'-diphenylsulfone bismaleimide, 2,2-bis[4-(4-maleimidophenoxy)phenyl]propane, 2,2-bis[3-s-butyl-4-8(4-maleimidophenoxy)phenyl]propane, 1,1-bis[4-(4-maleimidophenoxy)phenyl]decane, 4,4'-cyclohexylidene-bis[1-(4-maleimidophenoxy)-2-cyclohexyl]benzene, and 2,2-bis[4-(4-maleimidophenoxy)phenyl)hexafluoropropane.

The (meth)acrylate monomers may include a suitable (meth)acrylate monomer, for example, 1,6-hexanediolmono(meth)acrylate, 2-hydroxyethyl(meth)acrylate, 2-hydroxypropyl(meth)acrylate, 2-hydroxybutyl(meth)acrylate, 2-hydroxy-3-phenyloxypropyl(meth)acrylate, 1,4-butanediol (meth)acrylate, 2-hydroxyalkyl(meth)acryloyl phosphate, 4-hydroxycyclohexyl(meth)acrylate, neopentylglycol mono(meth)acrylate, trimethylolethane di(meth)acrylate, trimethylolpropane di(meth)acrylate, pentaerythritol tri(meth)acrylate, dipentaerythritol penta(meth)acrylate, pentaerythritol hexa(meth)acrylate, dipentaerythritol hexa(meth)acrylate, glycerol di(meth)acrylate, t-hydrofurfuryl(meth)acrylate, isodecyl(meth)acrylate, 2-(2-ethoxyethoxy)ethyl(meth)acrylate, stearyl(meth)acrylate, lauryl(meth)acrylate, 2-phenoxyethyl(meth)acrylate, isobornyl(meth)acrylate, tridecyl(meth)acrylate, ethoxylated nonylphenol(meth)acrylate, ethyleneglycol di(meth)acrylate, diethyleneglycol di(meth)acrylate, triethyleneglycol di(meth)acrylate, t-ethyleneglycol di(meth)acrylate, polyethyleneglycol di(meth)acrylate, 1,3-butyleneglycol di(meth)acrylate, tripropyleneglycol di(meth)acrylate, ethoxylated bisphenol A di(meth)acrylate, cyclohexanedimethanol di(meth)acrylate, phenoxy-t-glycol (meth)acrylate, 2-methacryloyloxyethyl phosphate, dimethylol tricyclodecane di(meth)acrylate, trimethylol-propanebenzoate acrylate, fluorene(meth)acrylate, and acid phosphoxyethyl methacrylate.

The (meth)acrylate group containing compound may be present in an amount of about 1 to about 10 wt %, preferably about 1 to about 5 wt % in terms of solid content based on the total amount of the anisotropic conductive adhesive composition. Within this range, adhesive strength of the composition may not be reduced despite an increase in pressing temperature, and non-curing of the composition may be prevented despite a decrease in pressing temperature, and thus connection reliability may be maintained.

Radical Curing Agent (f) Organic Peroxide

The organic peroxide may serve as a curing agent which generates free radicals when heated or exposed to light. Examples of the organic peroxide may include, for example, lauroyl peroxide, t-butylperoxylaurate, 1,1,3,3-t-methylbutyl peroxy-2-ethylhexanonate, 2,5-dimethyl-2,5-di(2-ethylhexanoyl peroxy)hexane, 1-cyclohexyl-1-methylethyl peroxy-2-ethylhexanonate, 2,5-dimethyl-2,5-di(m-toluoylperoxy)hexane, t-butyl peroxyisopropylmonocarbonate, t-butyl peroxy-2-ethylhexylmonocarbonate, t-hexyl peroxybenzoate, t-butyl peroxyacetate, dicumyl peroxide, 2,5-dimethyl-2,5-di(t-butylperoxy)hexane, t-butylcumylperoxide, t-hexyl peroxyneodecanoate, t-hexylperoxy-2-ethylhexanonate, t-butylperoxy-2-2-ethylhexanonate, t-butylperoxyisobutyrate, 1,1-bis (t-butylperoxy)cyclohexane, t-hexyl peroxyisopropylmonocarbonate, t-butylperoxy-3,5,5-trimethylhexanonate, t-butylperoxypivalate, cumylperoxyneodecanoate, diisopropylbenzenehydroperoxide, cumene hydroperoxide, isobutylperoxide, 2,4-dichlorobenzoylperoxide, 3,5,5-trimethylhexanoylperoxide, octanoylperoxide, stearoylperoxide, succinic peroxide, benzoylperoxide, 3,5,5-trimethylhexanoylperoxide, benzoylperoxytoluene, 1,1,3,3-tetramethylbutylperoxyneodecanoate, 1-cyclohexyl-1-methylethylperoxyneodecanoate, di-n-propylperoxycarbonate, diiso-propylperoxycarbonate, bis(4-t-butylcyclohexyl)peroxydicarbonate, di-2-ethoxymethoxyperoxydicarbonate, di(2-ethylhexylperoxy)dicarbonate, dimethoxy-butylperoxydicarbonate, di(3-methyl-3-methoxybutylperoxy)dicarbonate, 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-(t-butylperoxy)cyclododecane, 2,2-bis(t-butylperoxy)decane, t-butyltrimethylsilylperoxide, bis(t-butyl)dimethylsilylperoxide, t-butyltriallylsilylperoxide, bis(t-butyl)diallylsilylperoxide, and tris(t-butyl)allylsilylperoxide.

As the organic peroxide, a compound having a half-life temperature of about 5 hours to about 15 hours at about 40 to about 100° C. may be used. If the half-life temperature of the organic peroxide is within this range, the decomposition rate may be prevented from being too fast (if the decomposition rate is too fast, difficulties in room temperature storage may occur), and a polymerization rate may be prevented from being too slow, (if the polymerization rate is too slow, the quick curing may not be achieved).

The organic peroxide may be present in an amount of about 1 to about 10 wt % in terms of solid content based on the total amount of the anisotropic conductive adhesive composition. Within this range, a curing rate may not be reduced, thus properties of final pressing may not be deteriorated, and increase in brittleness of the anisotropic conductive adhesive film after curing by heating may be substantially prevented, thus the anisotropic conductive film may be completely removed during reworking.

Conductive Particles

The conductive particles may include suitable conductive particle. The conductive particles may include metal particles containing Au, Ag, Ni, Cu, and/or solder; carbon particles; particles of resins including polyethylene, polypropylene, polyester, polystyrene, polyvinyl alcohol or modified resins thereof, coated with Au, Ag, and/or Ni; and/or insulated particles obtained by coating the conductive particles with insulating particles. The conductive particles may have a size of about 2 to about 50 μm, and the size may be selected depending on the pitch of an employed circuit and purposes.

The conductive particles may be present in an amount of about 1 to about 10 wt %, preferably about 1 to about 5 wt % in terms of solid content based on the total amount of the anisotropic conductive adhesive composition. Within this range, the conductive particles may maintain a connection between circuits, and the anisotropic conductive adhesive film may maintain suitable insulating properties.

The composition for the anisotropic conductive adhesive film may further include, e.g., a pigment for coloring, a dye, a polymerization inhibitor, a silane coupling agent, or the like, in view of properties or workability of a product in order to obtain desired properties of the cured product. These components may be added in a suitable amount.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

Example 1

Preparation of Anisotropic Conductive Adhesive Film (1) Preparation of Anisotropic Conductive Adhesive Composition An anisotropic conductive adhesive composition was prepared by mixing (in terms of total solid content): 30 wt % of an acrylic acid ester copolymer containing an epoxy functional group, 5 wt % of a carboxyl group-modified acrylonitrile butadiene rubber, 15 wt % of a styrene-acrylonitrile resin, 20 wt % of isocyanuric acid ethylene oxide modified diacrylate (DSC exothermic peak: 92 to 95° C.), 20 wt % of bisphenol fluorene diacrylate (weight average molecular weight: 1,400 g/mol), 1.5 wt % of acid phosphoxyethyl methacrylate, 2.5 wt % phosphate acrylate (weight average molecular weight: 12,000 g/mol), 1.0 wt % of lauroyl peroxide and 2.0 wt % of benzoyl peroxide as organic peroxide, and 3 wt % of conductive polymer balls coated with nickel having an average diameter of 4 to 6 µm as conductive particles.

(2) Preparation of Anisotropic Conductive Adhesive Film

The anisotropic conductive adhesive composition prepared above was dissolved in an organic solvent, for example, toluene, and liquefied, after which the solution was stirred for a suitable time at a speed such that the conductive particles were not pulverized. Then, the solution was applied to a release film to a thickness of 10 to 50 µm, followed by drying for a suitable time to volatilize the organic solvent, thereby producing an anisotropic conductive film.

Example 2

An anisotropic conductive film according to Example 2 was prepared in the same manner as in Example 1 except that the contents of the acrylic acid ester copolymer, the isocyanuric acid ethylene oxide modified diacrylate, and the bisphenol fluorene diacrylate were changed to 35 wt %, 15 wt %, and 25 wt %, respectively.

Example 3

An anisotropic conductive film of Example 3 was prepared in the same manner as in Example 1 except that a urethane acrylate resin (C) (prepared as explained below) was used instead of the carboxyl group-modified acrylonitrile butadiene rubber.

Comparative Examples 1 to 3

Anisotropic conductive films were prepared in the same manner as in Example 1 except that a fluorene phenoxy resin was used instead of the acrylic acid ester copolymer (Comparative Example 1), dicyclopentaacrylate was used instead of the isocyanuric acid ethylene oxide modified diacrylate (Comparative Example 2), or dicyclopentaacrylate was used instead of the bisphenol fluorene diacrylate (Comparative Example 3).

TABLE 1

(Unit: wt %)

| | Ex. 1 | Ex. 2 | Ex. 3 | Comp. Ex. 1 | Comp. Ex. 2 | Comp. Ex. 2 |
|---|---|---|---|---|---|---|
| (A) Acrylonitrile butadiene rubber | 5 | 5 | | 5 | 5 | 5 |
| (B) Acrylic acid ester copolymer | 30 | 35 | 30 | | 30 | 30 |
| (C) Urethane acrylate resin | | | 5 | | | |
| * Fluorene phenoxy resin | | | | 30 | | |
| (D) Styrene-acrylonitrile resin | 15 | 15 | 15 | 15 | 15 | 15 |
| (E) Isocyanuric acid ethylene oxide modified diacrylate | 20 | 15 | 20 | 20 | | 30 |
| ** Dicyclopentaacrylate | | | | | 30 | 10 |
| (F) Bisphenol fluorene diacrylate | 20 | 25 | 20 | 20 | 10 | |
| (G) (Meth)acrylate group containing compound | 4 | 4 | 4 | 4 | 4 | 4 |
| (H) Organic peroxide | 3 | 3 | 3 | 3 | 3 | 3 |
| (I) Conductive particles | 3 | 3 | 3 | 3 | 3 | 3 |
| Total (in solid content) | 100 | 100 | 100 | 100 | 100 | 100 |

The components used in the above compositions are described below in greater detail.
(A) Acrylonitrile butadiene rubber: Carboxyl group-modified acrylonitrile butadiene rubber having weight average molecular weight of 240,000 g/mol (Nipol NBR, Zeon Co), solid content: 25% dissolved in toluene and methyl ethyl ketone (MEK).
(B) Acrylic acid ester copolymer: AOF7001 (Weight average molecular weight: 350,000 g/mol, containing epoxy functional group, solid content: 18%, Aekyung Chemical).
(C) Urethane acrylate resin: Polyurethane acrylate (Weight average molecular weight: 100,000 g/mol, Tg: 110° C.) synthesized using 50 vol % of MEK as a solvent by polymerization with a 60 vol % of polyol, a mole ratio of hydroxymethacrylate/aromatic isocyanate of 1.0, at 90° C., and 1 atm for 5 hours in the presence of dibutyltin dilaurate as a catalyst.
(D) Styrene-acrylonitrile resin having Tg of 120° C. and weight average molecular weight of 100,000 g/mol(Cheil Industries).
(E) Isocyanuric acid ethylene oxide modified diacrylate: Isocyanuric acid ethylene oxide modified diacrylate having DSC exothermic peak of 92 to 95° C.
(F) Bisphenol fluorene diacrylate having weight average molecular weight of 1400 g/mol.
(G) (Meth)acrylate group containing compound
Acid phosphoxyethyl methacrylate
Phosphate acrylate having weight average molecular weight of 12,000 g/mol.
(H) Organic peroxide: Lauroyl peroxide (solid content: 10% dissolved in toluene), benzoyl peroxide (solid content: 10% dissolved in toluene).
(I) Conductive particles: Conductive polymer balls coated with nickel having average diameter of 4 to 6 µm.
* Fluorene phenoxy resin: FX293 (Tohto Kasei Co., Ltd.).
** Dicyclopentaacrylate: DCP-A (Shin Nakamura Chemical).

Experimental Example: Measurement of adhesive strength, coefficient of thermal expansion, connection resistance, and modulus.

The anisotropic conductive adhesive films according to Examples 1 to 3 and Comparative Examples 1 to 3 were evaluated regarding adhesive strength, coefficient of thermal expansion, connection resistance, and modulus as follows.

Evaluation Methods (1) Adhesive Strength

To evaluate circuit connection performance of each anisotropic conductive adhesive film, pressing was conducted using an FPCB (Electrode height: 28 µm, BH Flex Co., Ltd.) and glass TEG (Unpatterned bare glass TEG, Cheil Industries).

The anisotropic conductive adhesive film was put on a circuit formed part of a glass panel and subjected to preliminary pressing at 80° C. and 1 MPa for 1 second. After removing the release film, an FPCB was placed on the film and subjected to final pressing at 180° C. and 3 MPa for 8 seconds. The pressed part was divided into 10 mm pieces, and the substrate or chip was bent at 90°, followed by measuring adhesive strength using a universal testing machine (H5KT, Hounsfield) while elevating a load cell at a constant rate. Then, to evaluate reliability, the circuit connected product (after having been subjected to preliminary and final pressing as explained above) was left under constant temperature and humidity conditions, i.e., at 85° C. and 85% RH, for 250 hours, and then adhesive strength was measured by the above method.

(2) Connection Resistance

Connection resistance of the film was measured by a 2 point probe method after preliminary pressing, final pressing and reliability testing at the constant temperature and humidity under the conditions described in the measurement of adhesive strength (1). The 2 point probe method used a resistance detector, and resistance between two points was measured using two probes connected to the detector. Resistance was calculated using voltage measured when the resistance detector applied 1 mA.

(3) Coefficient of Thermal Expansion

The coefficient of thermal expansion of the anisotropic conductive film was measured by mounting the cured film on a probe of a TMA (TA Instruments). Temperature was elevated at 10° C./min from 25 to 250° C. The coefficient of thermal expansion is defined as the extended length per unit temperature and unit length, which is measured as a gradient of a graph indicated by a detector.

(4) Modulus

Modulus was measured using ARES equipment while elevating temperature at 10° C./min from 30 to 250° C. Measurement was conducted at a strain of 5% and a frequency of 1.0 rad/sec.

Measurement results of the films according to Examples 1 to 3 and Comparative Examples 1 to 3 are illustrated in Table 2.

Embodiments may provide rapid low-temperature curing within a connection time of about 5 seconds or less at about 160 to about 200° C., and thus a pressing time is reduced, thereby increasing production efficiency.

By way of summary and review, when displays are large and thin, a pitch between electrodes and circuits may be required to be precise. An anisotropic conductive adhesive film may perform a very important role as an electrical connection material to connect fine circuit terminals. The anisotropic conductive adhesive film may require connection reliability to be used for a bonding material. As to connection resistance, adhesive strength, or the like, the resistance of the film measured in an initial state can increase or the adhesive strength of the film can decrease depending on storage conditions of the film, thereby deteriorating connection reliability. Further, bubbles can be generated in terminals in use of the film, causing decrease in connection reliability.

Epoxy resin adhesives may have a high adhesive strength and excellent water resistance or heat resistance. However, the epoxy resin adhesives may require heating for about 20 seconds at 140 to 180° C. or heating for about 10 seconds at 180 to 210° C. As the width of an electrode and the interval between electrodes become narrow due to a high-density circuit in the field of electronic equipment, wiring can be detached, separated, or deviate from the proper position

TABLE 2

| | | Example 1 | Example 2 | Example 3 | Comp. Ex. 1 | Comp. Ex. 2 | Comp. Ex. 3 |
|---|---|---|---|---|---|---|---|
| Miscibility with solvent | | ○ | ○ | ○ | X | ○ | ○ |
| Adhesive strength (gf/cm) | Initial | 1,210 | 1,270 | 1,350 | 1,430 | 1,220 | 1,470 |
| | 250-hour reliability test | 780 | 830 | 900 | 670 | 650 | 1,120 |
| Connection resistance (Ω) | Initial | 1.82 | 1.76 | 1.89 | 1.74 | 1.86 | 1.98 |
| | 250-hour reliability test | 2.15 | 2.09 | 2.11 | 2.82 | 2.97 | 5.36 |
| Modulus (gf/cm$^2$) | Minimum modulus before curing | 11,000 (93° C.) | 12,000 (90° C.) | 10,800 (88° C.) | 3,500 (90° C.) | 2,300 (92° C.) | 1,061 (85° C.) |
| | Minimum modulus after curing | 1,200,000 | 1,100,000 | 1,090,000 | 752,000 | 872,000 | 847,000 |
| Coefficient of thermal expansion (ppm/° C.) | 100° C. or less | 115 | 121 | 133 | 256 | 194 | 329 |

○: Miscible with solvent
X: Nonmiscible with solvent

As shown in Table 2, the anisotropic conductive adhesive compositions or films according to embodiments have improved dimensional stability after curing, improved connection reliability and stability, a remarkably low decreasing rate in adhesive strength, and a low increasing rate in connection resistance after reliability testing. The properties achieved by Examples 1-3 are summarized below:

Initial adhesive strength: 1000 gf/cm or more;
Adhesive strength after reliability test: 700 gf/cm or more;
Initial connection resistance: 2Ω or less;
Connection resistance after reliability testing: 2.5Ω or less;
Minimum modulus: $1 \times 10^4$ gf/cm$^2$ or more;
Modulus after curing: $1 \times 10^6$ gf/cm$^2$ or more; and
Coefficient of thermal expansion: 150 ppm/° C. or less at 100° C. or less.

when connection of the wiring is carried out using a circuit connection material containing epoxy resins. Accordingly, there is a need for an anisotropic conductive adhesive composition which achieves desired properties within a connection time of about 10 seconds or less, preferably about 5 seconds or less, to improve production efficiency.

Anisotropic conductive adhesive films that have a considerably high weight ratio of a binder system to a curing system may causing a decrease in dimensional stability after curing, and insufficient adhesion to a glass substrate. Such low dimensional stability may be a serious problem for a flexible printed circuit (FPC) having an electrode with a high height (about 25 μm or higher). Thus, it may be beneficial for an anisotropic conductive adhesive film to have improved adhesive strength and dimensional stability after curing for an FPC having an electrode with a high height, such as film on glass (FOG). Also, it may be beneficial for an anisotropic conductive adhesive film to have an improved filling ratio in an FPC to enhance adhesive strength and connection reliability without generating bubbles.

According to an embodiment, an anisotropic conductive adhesive film may include an acrylic acid ester copolymer having an epoxy functional group as a polymer binder system and an acrylate as a curing system having high reactivity and forming a strong structure after curing, and having a higher content ratio of a curing system to a binder system. The anisotropic conductive adhesive film may substantially prevent the occurrence of bubbles (e.g., by having an enhanced filling ratio) in a flexible printed circuit (FPC) having an electrode with a high height (about 25 μm or greater). The anisotropic conductive adhesive film may enable rapid low-temperature curing within a connection time of about 5 seconds or less at about 160 to about 200° C., to reduce a pressing time. In addition, the anisotropic conductive adhesive film may exhibit a high adhesive strength, connection reliability, and dimensional stability. In particular, a remarkably low decreasing rate in adhesive strength and a low increasing in connection resistance after reliability testing may be achieved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device bonded by an anisotropic conductive adhesive film formed from an anisotropic conductive adhesive composition, the anisotropic conductive adhesive composition having:
    a solid content ratio between a polymer binder system and a curing system of about 40:60 to about 60:40,
    wherein the polymer binder system includes an acrylic acid ester copolymer, and the curing system includes a bisphenol fluorene diacrylate and an isocyanuric acid ethylene oxide modified diacrylate, and
    wherein the anisotropic conductive adhesive film has:
        a coefficient of thermal expansion of about 150 ppm/° C. or less at about 100° C. or less, and
        a minimum modulus before curing of $1\times10^4$ gf/cm$^2$ or more.

2. The display device as claimed in claim 1, wherein a total amount of the bisphenol fluorene diacrylate and the isocyanuric acid ethylene oxide modified diacrylate is about 25 to about 50 wt % based on a total amount of the anisotropic conductive adhesive composition in terms of solid content.

3. A display device bonded by an anisotropic conductive adhesive film formed from an anisotropic conductive adhesive composition, the anisotropic conductive adhesive composition comprising:
    an acrylic acid ester copolymer;
    at least one selected from the group of a styrene-acrylonitrile resin, an acrylonitrile butadiene rubber, a urethane acrylate resin, an ester urethane resin, and a urethane resin other than the urethane acrylate resin and the ester urethane resin;
    an isocyanuric acid ethylene oxide modified diacrylate; and
    a bisphenol fluorene diacrylate,
    the anisotropic conductive adhesive film having a coefficient of thermal expansion of about 150 ppm/° C. or less at about 100° C. or less and a minimum modulus before curing of $1\times10^4$ gf/cm$^2$ or more.

4. The display device as claimed in claim 3, wherein the styrene-acrylonitrile resin, the acrylonitrile butadiene rubber, the urethane acrylate resin, the ester urethane resin and the urethane resin other than the urethane acrylate resin and the ester urethane resin have a glass transition temperature (Tg) of about 100° C. or higher.

5. The display device as claimed in claim 3, wherein a total amount of the bisphenol fluorene diacrylate and the isocyanuric acid ethylene oxide modified diacrylate is about 25 to about 50 wt % based on a total amount of the anisotropic conductive adhesive composition in terms of solid content.

6. The display device as claimed in claim 3, wherein the anisotropic conductive adhesive composition further comprises a (meth)acrylate group containing compound, an organic peroxide, and conductive particles.

7. The display device as claimed in claim 6, wherein the anisotropic conductive adhesive composition comprises:
    about 20 to about 40 wt % of the acrylic acid ester copolymer;
    about 1 to about 20 wt % of the at least one selected from the group of the styrene-acrylonitrile resin, the acrylonitrile butadiene rubber, the urethane acrylate resin, the ester urethane resin and the urethane resin other than the urethane acrylate resin and the ester urethane resin;
    about 5 to about 25 wt % of the isocyanuric acid ethylene oxide modified diacrylate;
    about 5 to about 25 wt % of the bisphenol fluorene diacrylate;
    about 1 to about 5 wt % of the (meth)acrylate group containing compound;
    about 1 to about 10 wt % of the organic peroxide; and
    about 1 to about 10 wt % of the conductive particles,
    based on a total amount of the anisotropic conductive adhesive composition in terms of solid content.

8. A display device, comprising:
    an anisotropic conductive adhesive film having a solid content ratio between a polymer binder system and a curing system of about 40:60 to about 60:40; and
    an electrode having a height of about 25 μm or more bonded by the anisotropic conductive adhesive film,
    wherein the polymer binder system includes an acrylic acid ester copolymer, and the curing system includes a bisphenol fluorene diacrylate and an isocyanuric acid ethylene oxide modified diacrylate, and
    wherein the anisotropic conductive adhesive film has a coefficient of thermal expansion of about 150 ppm/° C. or less at about 100° C. or less and a minimum modulus before curing of $1\times10^4$ gf/cm$^2$ or more.

9. The display device as claimed in claim 8, wherein the anisotropic conductive adhesive film has a connection time of about 5 seconds or less at about 160 to about 200° C.

10. The display device as claimed in claim 8, wherein the anisotropic conductive adhesive film has a bubble area of about 5% or less based on a total area of the anisotropic conductive adhesive film.

11. The display device as claimed in claim 8, wherein the display device comprises a film on glass form, and the anisotropic conductive adhesive film is bonded to the glass.

12. A display device bonded by an anisotropic conductive adhesive film, the anisotropic conductive adhesive film having an adhesive strength decreasing rate calculated by Equation 1 of greater than 0 and about 40% or less, a connection resistance increasing rate calculated by Equation 2 of greater than 0 and about 20% or less, and having a coefficient of thermal expansion of about 150 ppm/° C. or less at about 100° C. or less and a minimum modulus before curing of $1 \times 10^4$ gf/cm² or more:

$$\text{Adhesive strength decreasing rate } (\%) = |(A-B)/A| \times 100 \quad \text{Equation 1:}$$

$$\text{Connection resistance increasing rate } (\%) = |(C-D)/C| \times 100, \quad \text{Equation 2:}$$

where, in Equation 1, A is an adhesive strength after preliminary pressing at 80° C. and 1 MPa for 1 second and final pressing at 180° C. and 3 MPa for 5 seconds, B is an adhesive strength after the preliminary pressing, the final pressing, and then reliability testing at 85° C. and 85% RH for 250 hours, and in Equation 2, C is a connection resistance after preliminary pressing at 80° C. and 1 MPa for 1 second and final pressing at 180° C. and 3 MPa for 5 seconds, and D is a connection resistance after the preliminary pressing, the final pressing, and then reliability testing at 85° C. and 85% RH for 250 hours, wherein:
the anisotropic conductive adhesive film includes a polymer binder system and a curing system,
the polymer binder system includes an acrylic acid ester copolymer, and
the curing system includes a bisphenol fluorene diacrylate and an isocyanuric acid ethylene oxide modified diacrylate.

13. The display device as claimed in claim 12, wherein the anisotropic conductive adhesive film has an adhesive strength of about 700 gf/cm or more after the reliability testing and a connection resistance of about 2.5Ω or less after the reliability testing.

14. The display device as claimed in claim 12, wherein the anisotropic conductive adhesive film has a minimum modulus when cured of about $1 \times 10^6$ gf/cm² or more while elevating a temperature at 10° C./min from 30 to 250° C.

15. A display device bonded by an anisotropic conductive adhesive film formed from an anisotropic conductive adhesive composition, the anisotropic conductive adhesive composition having a total amount of a bisphenol fluorene diacrylate and an isocyanuric acid ethylene oxide modified diacrylate of about 25 to about 50 wt % based on a total amount of the anisotropic conductive adhesive composition in terms of solid content, the anisotropic conductive adhesive film having a coefficient of thermal expansion of about 150 ppm/° C. or less at about 100° C. or less and a minimum modulus before curing of $1 \times 10^4$ gf/cm² or more.

16. A display device bonded by an anisotropic conductive adhesive film formed from an anisotropic conductive adhesive composition, the anisotropic conductive adhesive composition including:

a polymer binder system, the polymer binder system including an acrylic acid ester copolymer; and a curing system, the curing system including a bisphenol fluorene diacrylate and an isocyanuric acid ethylene oxide modified diacrylate, wherein the anisotropic conductive adhesive film has a coefficient of thermal expansion of about 150 ppm/° C. or less at about 100° C. or less and a minimum modulus before curing of $1 \times 10^4$ gf/cm² or more.

* * * * *